US00RE39884E

(19) United States
(12) Reissued Patent
Östlund et al.

(10) Patent Number: US RE39,884 E
(45) Date of Reissued Patent: Oct. 16, 2007

(54) COATED MILLING INSERT AND METHOD OF MAKING IT

(75) Inventors: Åke Östlund, Hägersten (SE); Jeanette Persson, Nacka (SE); Björn Ljungberg, Enskede (SE)

(73) Assignee: Sandvik Intellectual Property AB, Sandviken (SE)

(21) Appl. No.: 11/483,381

(22) PCT Filed: Nov. 29, 1996

(86) PCT No.: PCT/SE96/01577

§ 371 (c)(1),
(2), (4) Date: Sep. 1, 1998

(87) PCT Pub. No.: WO97/20081

PCT Pub. Date: Jun. 5, 1997

Related U.S. Patent Documents

Reissue of:
(64) Patent No.: 6,177,178
Issued: Jan. 23, 2001
Appl. No.: 09/077,360
Filed: Sep. 1, 1998

(51) Int. Cl.
*C23C 16/30* (2006.01)
*B23B 27/14* (2006.01)

(52) U.S. Cl. ..... 428/216; 51/295; 51/307; 51/309; 427/255.1; 427/255.2; 427/255.7; 428/212; 428/336; 428/697; 428/658; 428/701; 428/702

(58) Field of Classification Search ..... 51/295, 51/307, 309; 427/255.1, 255.2, 255.7; 428/212, 428/336, 697, 698, 701, 702
See application file for complete search history.

(56) References Cited

U.S. PATENT DOCUMENTS 4,610,931 A 9/1986 Nemeth et al. ..... 75/241
4,643,620 A 2/1987 Fujii et al.
5,137,774 A 8/1992 Ruppi
5,162,147 A 11/1992 Ruppi et al.
5,372,873 A 12/1994 Yoshimura et al.
5,451,469 A 9/1995 Gustafson et al. ..... 428/548
5,545,490 A 8/1996 Oshika ..... 428/698
5,549,980 A 8/1996 Ostlund et al. ..... 51/295
5,576,093 A 11/1996 Yoshimura et al.
5,652,045 A 7/1997 Nakamura et al. ..... 428/212
5,674,564 A 10/1997 Ljungberg et al.
5,786,069 A 7/1998 Ljungberg et al. ..... 428/216
5,915,162 A 6/1999 Uchino et al. ..... 428/698
5,920,760 A 7/1999 Yoshimura et al. ..... 428/551

FOREIGN PATENT DOCUMENTS

EP 0653499 5/1995
EP 0686707 5/1995
EP 0685572 12/1995
EP 0693574 1/1996
EP 0709484 5/1996

OTHER PUBLICATIONS

Patent Abstracts of Japan, vol. 18, No. 392, C–1228, abstract of JP,A, 6–108254 (Mitsubishi Materials Corp), Apr. 19, 1994 & JP,A, 6108254.

Patent Abstract of Japan, vol. 18, No. 203, M–1590, abstract of JP,A, 6–8008 (Mitsubishi Materials Corp), Jan. 18, 1994 & JP,A, 6008008.

*Primary Examiner*—Archene Turner
(74) *Attorney, Agent, or Firm*—Drinker Biddle & Reath LLP

(57) ABSTRACT

A coated milling insert particularly useful for milling in low and medium alloyed steels with or without raw surface zones during wet or dry conditions. The insert is characterized by a WC-Co cemented carbide with a low content of cubic carbides and a highly W alloyed binder phase and a coating including an inner layer of $TiC_xN_yO_z$ with columnar grains, a layer of $\kappa$-$Al_2O_3$ and, preferably, a top layer of TiN. The layers are deposited by using CVD methods.

20 Claims, 1 Drawing Sheet

177,178 B1

COATED MILLING INSERT AND METHOD OF MAKING IT

Matter enclosed in heavy brackets [ ] appears in the original patent but forms no part of this reissue specification; matter printed in italics indicates the additions made by reissue.

*CROSS-REFERENCES TO RELATED APPLICATIONS*

*The present application is a reissue of U.S. Pat. No. 6,177,178 B1, which is a national stage application of PCT/SE96/01577 file Nov. 29, 1996, and which claims the benefit of priority to Swedish Application No. 9504304-8 filed Nov. 30, 1995.*

BACKGROUND OF THE INVENTION

The present invention relates to a coated cutting tool (cemented carbide insert) particularly useful for wet and dry milling of low and medium alloyed steels, with raw surfaces such as cast skin, forged skin, hot or cold rolled skin or pre-machined surfaces.

When milling low and medium alloyed steels with cemented carbide tools, the cutting edge is worn according to different wear mechanisms, such as chemical wear, abrasive wear, adhesive wear and by edge chipping caused by cracks formed along the cutting edge, the comb cracks.

The comb crack formation is particularly severe when wet milling is employed (using coolant). Coolant and work piece material may penetrate and widen the comb cracks and the edge will start to chip. A chipped edge will generate a bad surface finish of the machined component.

Different cutting conditions require different properties of the cutting insert. For example, when cutting in steels with raw surface zones, a coated cemented carbide insert must consist of a tough carbide and have very good coating adhesion. When milling in low alloyed steels the adhesive wear is generally the dominating wear type. Here preferably thin (1–3 μm) CVD- or PVD-coatings have to be used.

Measures can be taken to improve the cutting performance with respect to a specific wear type. However, very often such action will have a negative effect on other wear properties.

The influence of some possible measures is given below:

1.) Comb crack formation can be reduced by lowering the binder phase content. However, such action will lower the toughness properties of the cutting inserts which is not desirable.

2.) Improved abrasive wear can be obtained by increasing the coating thickness. However, thick coatings increase the risk for flaking and will lower the resistance to adhesive wear.

3.) Milling at high cutting speeds and at high cutting edge temperatures requires a cemented carbide with a rather high amount of cubic carbides (solid solution of WC-TiC-TaC-NbC). Such carbides will more easily develop comb cracks.

So far it has been very difficult to improve all tool properties simultaneously. Commercial cemented carbide grades have therefore been optimized with respect to one or few of these wear types and hence to specific application areas.

Swedish patent application 9501286-0 which corresponds to U.S. Ser. No. 08/616,012, herein incorporated by reference discloses a coated cutting insert particularly useful for dry milling of grey cast iron. The insert is characterized by a straight WC-Co cemented carbide grade and a coating including a layer of $TiC_xN_yO_z$ with columnar grains and a top layer of fine grained textured $\alpha$-$Al_2O_3$.

Swedish patent application 9502640-7 which corresponds to U.S. Ser. No. 08/675,034, herein incorporated by reference, discloses a coated turning insert particularly useful for intermittent turning in low alloyed steel. The insert is characterized by a WC-Co cemented carbide body having a highly W-alloyed Co-binder phase and a coating including a layer of $TiC_xN_yO_z$ with columnar grains and a top layer of a fine grained, textured $\alpha$-$Al_2O_3$.

Swedish patent application 9503056-5 which corresponds to U.S. Ser. No. 08/703,965, herein incorporated by reference, discloses a coated turning cutting tool particularly useful for cutting in hot and cold forged low alloyed steel. The insert is characterized by a WC-Co cemented carbide body having a highly W-alloyed Co-binder phase and a coating including a layer of $TiC_xN_yO_z$ with columnar grains and a top layer of a fine grained, $\alpha$-$Al_2O_3$.

OBJECTS AND SUMMARY OF THE INVENTION

It is an object of this invention to avoid or alleviate the problems of the prior art.

It is further an object of this invention to provide a coated cutting tool particularly useful for wet and dry milling of low and medium alloyed steels.

In one aspect of the invention there is provided a cutting tool insert for milling low and medium alloyed steels with or without raw surfaces during wet or dry conditions comprising a cemented carbide body and a coating wherein said cemented carbide body comprises WC, 8.6–9.5 wt-% Co and 0.2–1.8 wt-% cubic carbides of Ta, Ti and Nb, with Ti present on a level corresponding to a technical impurity, and a highly W-alloyed binder phase with a CW-ratio of 0.78–0.93 and said coating comprises a first (innermost) layer of $TiC_xN_yO_z$ with x+y+z=1, with a thickness of 0.1–1.5 μm, and with equiaxed grains with size <0.5 μm a second layer of $TiC_xN_yO_z$ with x+y+z=1, with a thickness of 1–6 μm with columnar grains with diameter of <5 μm and a layer of a smooth, fine-grained (0.5–2 μm) $\kappa$-$Al_2O_3$ with a thickness of 0.5–5 μm.

In another aspect of the invention, there is provided a method of making a milling insert comprising a cemented carbide body and a coating comprising a WC-Co-based cemented carbide body with a highly W-alloyed binder phase with a CW-ratio of 0.78–0.93 with a first (innermost) layer of $TiC_xN_yO_z$ with x+y+z=1, with a thickness of 0.1–1.5 μm, with equiaxed grains with size <0.5 μm using known CVD-methods a second layer of $TiC_xN_yO_z$ with x+y+z=1, with a thickness of 1–6 μm with columnar grains with a diameter of about <5 μm deposited by MTCVD-technique, using acetonitrile as the carbon and nitrogen source for forming the layer in a preferred temperature range of 850–900° C. and a layer of a smooth $\kappa$-$Al_2O_3$ with a thickness of 0.5–5 μm.

BRIEF DESCRIPTION OF THE DRAWINGS

The FIGURE is a micrograph in 10,000× magnification of a coated insert according to the present invention in which A—cemented carbide body B—$TiC_xN_yO_z$-layer with equiaxed grains C—$TiC_xN_yO_z$-layer with columnar grains D—κ-$Al_2O_3$-layer with columnar like grains E—TiN-layer preferred, could be an option.

DETAILED DESCRIPTION OF THE PREFERRED EMBODIMENTS OF THE INVENTION

Figure 1:
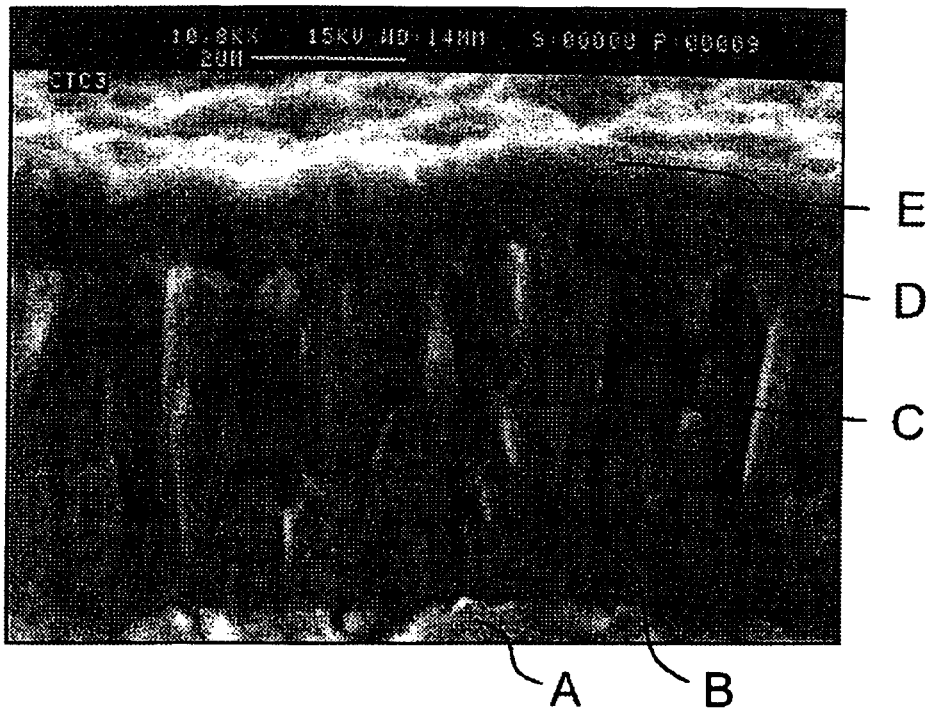
Figure 1:
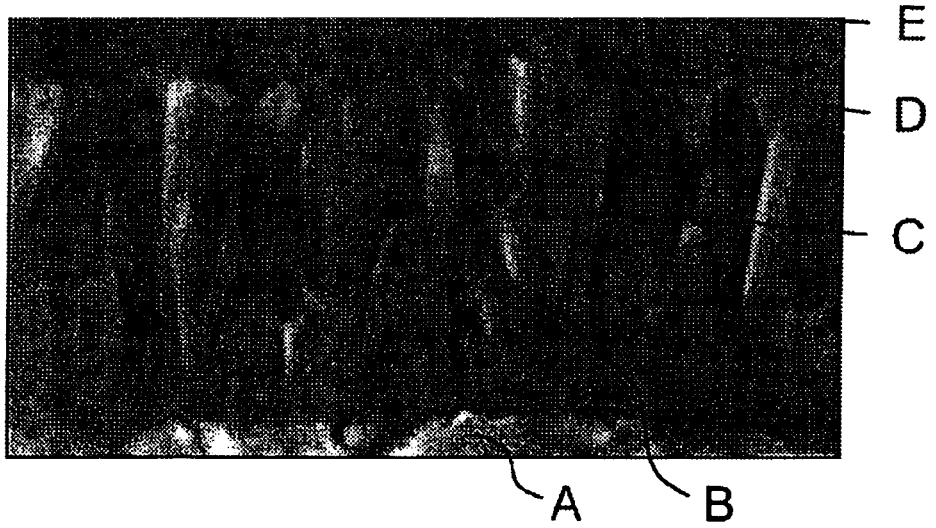

It has now surprisingly been found that by combining many different features, a cutting tool for milling with excellent cutting performance in low and medium alloyed steel with or without raw surface zones both in wet and dry milling can be obtained. The cutting tool according to the invention shows improved properties with respect to many of the wear types earlier mentioned.

The milling cutting insert according to the invention is: a cemented carbide body with a highly W-alloyed binder phase and with a well-balanced chemical composition and grain size of the WC, a columnar $TiC_xN_yO_z$-layer, a κ-$Al_2O_3$-layer, a TiN-layer and optionally followed by smoothening, the cutting edges by brushing the edges with, e.g., a SiC based brush.

According to the present invention, a milling tool insert is provided with a cemented carbide body with a composition of 8.6–9.5 wt % Co, preferably 8.7–9.5 wt % Co, most preferably 8.8–9.4 wt % Co, 0.2–1.8 wt % cubic carbides, preferably 0.4–1.8 wt % cubic carbides, most preferably 0.5–1.7 wt % cubic carbides of the metals Ta, Nb and Ti and balance WC. The cemented carbide may also contain other carbides from elements from group IVb, Vb or VIb of the periodic table. The content of Ti is preferably on a level corresponding to a technical impurity. The average grain size of the WC is in the range of about 1.5–2 μm, preferably about 1.7 μm.

The cobalt binder phase is highly alloyed with W. The content of W in the binder phase can be expressed as the [CW-ratio=$M_s$/(wt % Co 0.0161)] *CW-ratio=$M_s$/(wt % Co×0.0161)*, where $M_s$ is the measured saturation magnetization of the cemented carbide body in [kA/m] *$hAm^2/kg$* and wt % Co is the weight percentage of Co in the cemented carbide. The CW-value is a function of the W content in the Co binder phase. A low CW-value corresponds to a high W-content in the binder phase.

It has now been found according to the present invention, that improved cutting performance is achieved if the cemented carbide body has a CW-ratio of 0.78–0.93, preferably 0.80–0.91, and most preferably 0.82–0.90. The cemented carbide may contain small amounts, <1 volume %, of η-phase ($M_6C$), without any detrimental effect. From the CW-value, it follows that no free graphite is allowed in the cemented carbide body according to the present invention.

The cement carbide body may contain a thin (about 5–25 μm) surface zone depleted in cubic carbides and often enriched in binder phase according to prior art such as disclosed in U.S. Pat. No. 4,610,931. In this case, the cemented carbide may contain carbonitride or even nitride.

The coating comprises

- a first (innermost) layer of $TiC_xN_yO_z$ with x+y+z=1, preferably z<0.5, with equiaxed grains with size <0.5 μm and a total thickness <1.5 μm and preferably >0.1 μm.
- a layer of $TiC_xN_yO_z$ with x+y+z=1, preferably with z=0 and x>0.3 and y>0.3, with a thickness of 1–6 μm, preferably 2–5 μm, with columnar grains and with an average diameter of about <5 μm, preferably 0.1–2 μm
- a layer of a smooth, fine-grained (grain size about 0.5–2 μm) $Al_2O_3$ consisting essentially of the κ-phase. However, the layer may contain small amounts, 1–3 vol-%, of the θ- or the α-phases as determined by XRD-measurement. The $Al_2O_3$-layer has a thickness of 0.5–5 μm, preferably 0.5–2 μm, and most preferably 0.5–1.5 μm. Preferably, this $Al_2O_3$-layer is followed by a further layer (<1 μm, preferably 0.1–0.5 μm thick) of TiN, but the $Al_2O_3$ layer can be the outermost layer. This outermost layer, $Al_2O_3$ or TiN, has a surface roughness $R_{max} \leqq 0.4$ μm over a length of 10 μm. The TiN-layer, if present, is preferably removed along the cutting edge.

According to the method of the invention, a WC-Co-based cemented carbide body is made with a highly W-alloyed binder phase with a CW-ratio according to above, and a content of cubic carbide according to above, and a WC grain size according to above, and preferably without a binder phase enriched surface zone, a first (innermost) layer of $TiC_xN_yO_z$ with x+y+z=1, preferably z<0.5, with a thickness of <1.5 μm, and with equiaxed grains with size <0.5 μm using known CVD-methods.

- a layer of $TiC_xN_yO_z$ x+y+z=1, preferably with z=0 and x>0.3 and y>0.3, with a thickness of 1–6 μm, preferably 2–5 μm, with columnar grains and with an average diameter of about <5 μm, preferably <2 μm, using preferably MTCVD-technique (using acetonitrile as the carbon and nitrogen source for forming the layer in the temperature range of 700–900° C.). The exact conditions, however, depend to a certain extent on the design of the equipment used.
- a smooth $Al_2O_3$-layer essentially consisting of κ-$Al_2O_3$ is deposited under conditions disclosed in e.g. EP-A-523 021 which corresponds to U.S. Pat. No. 5,674,564, herein incorporated by reference. The $Al_2O_3$ layer has a thickness of 0.5–5 μm, preferably 0.5–2 μm, and most preferably 0.5–1.5 μm. Preferably, a further layer (<1 μm, preferably 0.1–0.5 μm thick) of TiN is deposited, but the $Al_2O_3$ layer can be the outermost layer. This outermost layer, $Al_2O_3$ or TiN, has a surface roughness $R_{max} \leqq 0.4$ μm over a length of 10 μm. The smooth coating surface can be obtained by a gentle wet-blasting of the coating surface with fine-grained (400–150 mesh) alumina powder or by brushing (preferably used when TiN top coating is present) the edges with brushes based on, e.g.; SiC as disclosed, e.g.; in Swedish patent application 9402543-4 which corresponds to U.S. Ser. No. 08/497,934, herein incorporated by reference. The TiN-layer, if present, is preferably removed along the cutting edge.

The invention is additionally illustrated in connection with the following Examples which are to be considered as illustrative of the present invention. It should be understood, however, that the invention is not limited to the specific details of the Examples.

EXAMPLE 1

A. A cemented carbide milling tool in accordance with the invention, inserts of style SEKN 1204 AZ with the composition 9.1 wt-% Co, 1.25 wt-% TaC, 0.30 wt-% NbC and balance WC, with a binder phase highly alloyed with W, corresponding to a CW-ratio of 0.86 were coated with a 0.5 μm equiaxed TiCN-layer (with a high nitrogen content corresponding to an estimated C/N-ratio of 0.05) followed by a 4 μm thick TiCN-layer with columnar grains by using MTCVD-technique (temperature 885–850° C. and $CH_3CN$ as the carbon/nitrogen source). In subsequent steps during the same coating cycle, a 1.0 μm thick layer of $Al_2O_3$ was deposited using a temperature 970° C. and a concentration of $H_2S$ dopant of 0.4% as disclosed in EP-A-523 021 which corresponds to U.S. Pat. No. 5,674,564. A thin (0.3 μm) layer of TiN was deposited on top, according to known CVD-technique. XRD-measurement showed that the $Al_2O_3$-layer consisted of 100% κ-phase. The cemented carbide body had a WC grain size in average of 1.65 μm. The coated inserts were brushed by a nylon straw brush containing SiC grains. Examination of the brushed inserts in a light microscope showed that the thin TiN-layer had been brushed away only along the cutting edge, leaving there a smooth $Al_2O_3$-layer surface. Coating thickness measurements on cross sectioned brushed samples showed no reduction of the coating along the edge line except for the outer TiN-layer that was removed.

B. A strongly competitive cemented carbide grade in style SEKN 1204 from an external leading carbide producer was selected for comparison in a wet milling test. The carbide had a composition of 9.0 wt-% Co, 0.2 wt-% TiC, 0.5 wt-% TaC, 0.1 wt % NbC balance WC and a CW-ratio of 0.95. The WC-grain size was 2.5 μm. The insert had a coating consisting of a 6 μm TiCN layer and a 0.3 μm TiN layer.

The insert from A was compared against the insert from B in a wet milling test in a medium alloyed steel (HB=310) with hot-rolled surfaces. Two parallel bars, each having a thickness of 35 mm, were centrally positioned relative to the cutter body (diameter 100 mm), and the bars were placed with an air gap of 10 mm between them.

The cutting data were:

Speed=160 m/min,

Feed=0.20 mm/rev

Cutting depth=2 mm, single tooth milling with coolant.

A comparison was made after milling 1200 mm. Variant A, according to the invention, showed no comb cracks and variant B showed 14 comb cracks. After milling 1800 mm, variant B broke down due to a lot of chipping and fracture between the comb cracks. Variant A, according to the invention, lasted 4200 mm, corresponding to an effective tool life of 11 min compared with about 4 min for variant B.

EXAMPLE 2

A. A cemented carbide milling tool in accordance with the invention, inserts of style SEKN 1204 AZ with the composition 9.1 wt-% Co, 1.23 wt-% TaC, 0.30 wt-% NbC and balance WC, with a binder phase highly alloyed with W corresponding to a CW-ratio of 0.85 were coated with a 0.5 μm equiaxed TiCN-layer (with a high nitrogen content corresponding to an estimated C/N-ratio of 0.05) followed by a 3.7 μm thick TiCN-layer with columnar grains by using MTCVD-technique (temperature 885–850° C. and $CH_3CN$ as the carbon/nitrogen source). In subsequent steps during the same coating cycle, a 0.9 μm thick layer of $Al_2O_3$ was deposited using a temperature 970° C. and a concentration of $H_2S$ dopant of 0.4% as disclosed in EP-A-523 021 which corresponds to U.S. Pat. No. 5,674,564. (A thin (0.3 μm) layer of TiN was deposited on top according to known CVD-technique. XRD-measurement showed that the $Al_2O_3$-layer consisted of 100% κ-phase. The cemented carbide body had a WC grain size in average of 1.6 μm.

B. A strongly competitive cemented carbide grade in style SEKN 1204 from an external leading cemented carbide producer was selected for comparison in a wet milling test. The carbide had a composition of 11.0 wt-% Co, 0.2 wt-% TaC, 0.3 wt % NbC balance WC and a CW-ratio of 0.90. The insert had a coating consisting of a 0.5 μm equiaxed TiCN layer, 2.0 μm TiCN columnar layer, 2.0 μm κ-$Al_2O_3$-layer and a 0.3 μm TiN-layer.

C. A strongly competitive cemented carbide grade in style SEKN 1204 from an external leading carbide producer was used. The carbide had a composition of 7.5 wt-% Co, 0.4 wt-% TaC, 0.1 wt % NbC, 0.3 wt % TiC balance WC and a CW-ratio of 0.95. The insert had a coating consisting of a 0.5 μm equiaxed TiCN-layer, 2.1 μm columnar TiCN-layer, 2.2 μm κ-$Al_2O_3$-layer and a 0.3 μm TiN-layer.

Inserts from A were compared against inserts from B and C in a wet milling test in a low alloyed steel (HB=190) with hot rolled surfaces. The bars were, as very common extremely rusty due to outdoor stocking. Two parallel bars each of a thickness having 32 mm were centrally positioned relative to the cutter body (diameter 100 mm), and the bars were placed with an air gap of 10 mm between them.

The cutting data were:

Speed=150 m/min,

Feed=0.20 mm/rev

Cutting depth=2 mm, single tooth milling with coolant.

The insert C broke after 1100 mm, the insert B broke after 2150 mm and the insert A, according to the invention, broke after 2400 mm.

In this test all coatings were of similar type, and the major difference was on the cemented carbide. The results show that the coated cemented carbide according to the invention, exhibited longer tool life than two important competitor grades containing less and more binder phase resp than the coated grade according to the invention.

EXAMPLE 3

A. A cemented carbide milling tool in accordance with the invention, inserts of style SEKN 1204 AZ with the composition 9.1 wt-% Co, 1.23 wt-% TaC, 0.30 wt-% NbC and balance WC, with a binder phase highly alloyed with W corresponding to a CW-ratio of 0.86 were coated with a 0.5 μm equiaxed TiCN-layer (with a high nitrogen content corresponding to an estimated C/N-ratio of 0.05) followed by a 3.7 μm thick TiCN-layer with columnar grains by using MTCVD-technique (temperature 885–850° C. and $CH_3CN$ as the carbon/nitrogen source). In subsequent steps during the same coating cycle, a 1.1 μm thick layer of $Al_2O_3$ was deposited using a temperature of 970° C. and a concentration of $H_2S$ dopant of 0.4% as disclosed in EP-A-523 021 which corresponds to U.S. Pat. No. 5,674,564. A thin (0.3 μm) layer of TiN was deposited on top according to known CVD-technique. XRD-measurement showed that the $Al_2O_3$-layer consisted of 100% κ-phase. The cemented carbide body had a WC grain size in average of 1.7 μm. The coated inserts were brushed by a nylon straw brush containing SiC grains. Examination of the brushed inserts in a light microscope showed that the thin TiN-layer had been brushed away only along the cutting edge leaving there a smooth $Al_2O_3$-layer surface. Coating thickness measurements on cross-sectioned brushed samples showed no reduction of the coating along the edge line except for the outer TiN-layer that was removed.

B. A strongly competitive cemented carbide grade in style SEKN 1204 from an external leading carbide producer was used. The carbide had a composition of 8.0 wt-% Co, 1.9 wt-% TaC, 0.2 wt % NbC, 0.2 wt % TiC balance WC and a CW-ratio of 0.85. The insert had a coating consisting of a 1.1 μm TiN layer and 3.3 μm TiC layer.

C. A strongly competitive cemented carbide grade in style SEKN 1204 from an external leading carbide producer was used. The carbide (had a composition of 10.0 wt-% Co, 2.0 wt-% TaC, 0.2 wt % TiC, balance WC and a CW-ratio of 0.90. The insert had a coating consisting of a 0.5 μm equiaxed TiCN layer, 3.3 μm TiCN columnar layer, 0.7 μm κ-$Al_2O_3$-layer and a 0.5 μm TiN layer.

Inserts from A were compared against inserts from B and C in a dry milling test in a low alloyed steel (HB=290) with pre machined surfaces. A bar with a thickness of 180 mm was centrally positioned relative to the cutter body (diameter 250 mm).

The cutting data were:

Speed=204 m/min,

Feed=0.22 mm/rev

Cutting depth=2 mm, single tooth milling dry conditions.

Insert B broke after 5000 mm after comb crack formation and chipping. Insert C broke after 5400 mm by similar wear pattern and insert A was stopped after 6000 mm without other visible wear than a few small comb cracks.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A cutting tool insert for milling low and medium alloyed steels with or without raw surfaces during wet or dry conditions comprising a cemented carbide body and a coating wherein said cemented carbide body comprises WC, 8.6–9.5 wt-% Co and 0.2–1.8 wt-% cubic carbides of Ta, Ti and Nb, with Ti present on a level corresponding to a technical impurity, and a highly W-alloyed binder phase with a CW-ratio of 0.78–0.93 and said coating comprises a first (innermost) layer of $TiC_xN_yO_z$ with x+y+z=1, with a thickness of 0.1–1.5 μm, and with equiaxed grains with size <0.5 μm a second layer of $TiC_xN_yO_z$ with x+y+z=1, with a thickness of 1–6 μm with columnar grains with diameter of <5 μm and a layer of a smooth, fine-grained (0.5–2 μm) κ-$Al_2O_3$ with a thickness of 0.5–5 μm.

2. The milling insert of claim 1 wherein the cemented carbide has the composition of 8.8–9.4 wt-% Co and 0.4–1.8 wt-% carbides of Ta and Nb.

3. The milling insert of claim 1 wherein the CW-ratio is from 0.82–0.90.

4. The milling insert of claim 1 further comprising an outermost TiN-layer which has been removed along the cutting edge.

5. A method of making a milling insert comprising a cemented carbide body and a coating comprising coating a WC-Co-based cemented carbide body with a highly W-alloyed binder phase with a CW-ratio of 0.78–0.93 with a first (innermost) layer of $TiC_xN_yO_z$ with x+y+z=1, with a thickness of 0.1–1.5 μm, with equiaxed grains with size <0.5 μm using known CVD-methods a second layer of $TiC_xN_yO_z$ with x+y+z=1, with a thickness of 1–6 μm with columnar grains with a diameter of about <5 μm deposited by MTCVD-technique, using acetonitrile as the carbon and nitrogen source for forming the layer in a preferred temperature range of 850–900° C. and a layer of a smooth κ-$Al_2O_3$ with a thickness of 0.5–5 μm.

6. The method of claim 5 wherein said cemented carbide body has a cobalt content of 8.8–9.4 wt-% and cubic carbides of Ta and Nb.

7. The method of claim 5 wherein the CW-ratio is from 0.82–0.90.

8. The method of claim 5 further comprising an outermost TiN-layer which is removed along the cutting edge.

9. The cutting tool insert of claim 1 wherein in the first (innermost) layer of $TiC_xN_yO_z$, z<0.5 and in the second layer of $TiC_xN_yO_z$, z=0, x>0.3 and y>0.3.

10. The cutting tool insert of claim 1 wherein the insert contains an outermost layer of TiN with a thickness of [>1] *<1* μm.

11. The method of claim 5 wherein in the first (innermost) layer of $TiC_xN_yO_z$, z<0.5 and in the second layer of $TiC_xN_yO_z$, z=0, x>0.3 and y>0.3.

12. The method of claim 5 wherein the insert contains an outermost layer of TiN with a thickness of <1 μm.

*13. The cutting tool insert of claim 1 wherein the CW-ratio is 0.80–0.91.*

*14. The cutting tool insert of claim 1 wherein an average grain size of WC is in the range of or about 1.5–2.0 μm.*

*15. The cutting tool insert of claim 1 wherein a surface roughness of the layer of κ-$Al_2O_3$ is less than or equal to 0.4 μm.*

*16. The cutting tool insert of claim 10 wherein a surface roughness of the outermost TiN-layer is less than or equal to 0.4 μm.*

*17. The method of claim 5 wherein the CW-ratio is 0.80–0.91.*

*18. The method of claim 5 wherein an average grain size of WC is in the range of or about 1.5–2.0 μm.*

*19. The method of claim 5 wherein a surface roughness of the layer of κ-$Al_2O_3$ is less than or equal to 0.4 μm.*

*20. The method of claim 12 wherein a surface roughness of the outermost TiN-layer is less than or equal to 0.4 μm.*

* * * * *